(12) United States Patent
Goto

(10) Patent No.: US 7,129,796 B2
(45) Date of Patent: Oct. 31, 2006

(54) OSCILLATOR CIRCUIT WITH SUPPORTING TRANSISTOR FOR VOLTAGE SWEEP

(75) Inventor: Kensuke Goto, Ota (JP)

(73) Assignee: Sanyo Electric Co., Ltd., Osaka (JP)

( * ) Notice: Subject to any disclaimer, the term of this patent is extended or adjusted under 35 U.S.C. 154(b) by 77 days.

(21) Appl. No.: 10/994,514

(22) Filed: Nov. 23, 2004

(65) Prior Publication Data

US 2005/0122178 A1    Jun. 9, 2005

(30) Foreign Application Priority Data

Nov. 25, 2003    (JP) .............................. 2003-393537

(51) Int. Cl.
*H03L 7/00*    (2006.01)

(52) U.S. Cl. ...................... 331/57; 331/17; 331/182; 331/185; 331/186

(58) Field of Classification Search .................. 331/17, 331/57, 182, 185, 186
See application file for complete search history.

(56) References Cited

U.S. PATENT DOCUMENTS 5,418,499 A * 5/1995 Nakao ......................... 331/57

FOREIGN PATENT DOCUMENTS

| JP | 5-186474 | 7/1993 |
| JP | 08-186474 | 7/1996 |

* cited by examiner

*Primary Examiner*—Joseph Chang
*Assistant Examiner*—Levi Gannon
(74) *Attorney, Agent, or Firm*—Morrison & Foerster LLP

(57) ABSTRACT

The ring oscillator circuit with the current mirror type current limit circuit of this invention prevents the malfunction and the halt of the ring oscillator. The ring oscillator is configured with the serially connected CMOS inverters INV1–INV5 where the output of the last CMOS inverter INV5 is fed back to the input of the first CMOS inverter INV1. Also, the current mirror type current limit circuit for controlling the electric current going through the CMOS inverters INV1–INV5 is formed. The first supporting transistor T1 that helps the output of the CMOS inverter INV5 achieve the full-swing for reaching the power supply voltage Vdd and the second supporting transistor T2 that helps the output of the CMOS inverter INV5 achieve the full-swing for reaching the ground voltage Vss according to the output of the CMOS inverter INV3 two positions ahead of the last inverter INV5 are also formed.

6 Claims, 11 Drawing Sheets

OSCILLATOR CIRCUIT WITH SUPPORTING TRANSISTOR FOR VOLTAGE SWEEP

CROSS-REFERENCE OF THE INVENTION

This invention is based on Japanese Patent Application No. 2003-393537, the content of which is incorporated herein by reference in its entirety.

BACKGROUND OF THE INVENTION

1. Field of the Invention

This invention relates to an oscillator circuit, specifically to a ring oscillator circuit provided with a current mirror type current limit circuit.

2. Description of Related Art

A ring oscillator has been used as an oscillator circuit for the various kinds of semi-conductor integrated circuits. It is necessary to acquire a low frequency oscillator clock signal when the ring oscillator is used as the self-refreshing oscillator circuit in a memory circuit such as DRAM. The low frequency oscillation is acquired by suppressing the electric current of the ring oscillator using a current mirror type current limit circuit.

FIG. 3 shows a ring oscillator type oscillator circuit provided with a current mirror type current limit circuit. In this oscillator circuit, five CMOS inverters INV1, INV2, INV3, INV4 and INV5 are serially connected, and the output of the last inverter INV5 is fed back to the input of the first inverter INV1, configuring a ring oscillator.

A current mirror type current limit circuit 10 has a P-channel type MOS transistor PM1, a resistor circuit 20 including a plurality of N-channel type MOS transistors connected in series with a power supply voltage Vdd applied at the gate of each transistor, and an N-channel type MOS transistor NM1. The drain and the gate of the P-channel type MOS transistor PM1 are connected with each other and the source of the transistor is provided with the power supply voltage Vdd. Also, the drain of the P-channel type MOS transistor PM1 is connected to the resistor circuit 20. The drain and the gate of the N-channel type MOS transistor NM1 are connected with each other and the source of the transistor is provided with the ground voltage Vss. Also, the drain of the N-channel type MOS transistor NM1 is connected to the resistor circuit 20. The electric current going through the P-channel type MOS transistor PM1 and the N-channel type MOS transistor NM1 is adjusted by the resistance of the resistor circuit 20. The resistance of the resistor circuit 20 is adjustable according to the number of the N-channel type MOS transistors serially connected.

The gate of the P-channel type MOS transistor PM1 is connected to each gate of the P-channel type MOS transistors PM2, PM3, PM4, PM5, and PM6 that are formed at the side of the power supply voltage Vdd of each of the CMOS inverters. Therefore, each of the P-channel type MOS transistors PM2, PM3, PM4, PM5, and PM6 forms a current mirror with the P-channel type MOS transistor PM1 respectively, with each of the P-channel type MOS transistors PM2, PM3, PM4, PM5, and PM6 having the same electric current as that of the P-channel type MOS transistor PM1, which enables limiting the electric current.

The gate of the N-channel type MOS transistor NM1 is connected to each gate of the N-channel type MOS transistors NM2, NM3, NM4, NM5, and NM6 that are formed at the side of the ground voltage Vss of each of the CMOS inverters. Therefore, each of the N-channel type MOS transistors NM2, NM3, NM4, NM5, and NM6 forms a current mirror with the N-channel type MOS transistor NM1 respectively, with each of the N-channel type MOS transistors NM2, NM3, NM4, NM5, and NM6 having the same electric current as that of the N-channel type MOS transistor NM1, which enables limiting the electric current.

The output of the last CMOS inverter INV5 of the ring oscillator is applied to the gates of a P-channel type MOS transistor PM7 and an N-channel type MOS transistor NM7 of the outputting CMOS inverter INV6. The output of the CMOS inverter INV3, which is located two positions ahead of the last inverter INV5 of the ring oscillator, is applied to the gates of a P-channel type MOS transistor PM8 and an N-channel type MOS transistor NM8 of the same outputting CMOS inverter INV6.

The oscillation waveform is adjusted by eliminating the through current of the CMOS inverter INV6, which is achieved by switching the P-channel type, MOS transistor PM8 and the N-channel type MOS transistor NM8 earlier than the P-channel type MOS transistor PM7 and the N-channel type MOS transistor NM7 using the output of the CMOS inverter INV3. Furthermore, the output of the CMOS inverter INV6 is applied to the input terminal of the CMOS inverter INV7. An oscillation clock signal RCLK is acquired from the output of the CMOS inverter INV7.

A P-channel type MOS transistor PM9 formed at the output terminal of the first CMOS inverter INV1 and an N-channel type MOS transistor NM9 inserted to a current path of the CMOS inverter INV1 are both transistors for resetting controlled by a reset signal SRE.

FIGS. 4A–4C show the oscillation waveforms acquired from the circuit simulation of the oscillator circuit described above. FIG. 4A is a waveform of the output of the CMOS inverter INV3 at a node N5, FIG. 4B is a waveform of output of the last CMOS inverter INV5 at a node N7, and FIG. 4C is a waveform of the oscillation clock signal RCLK outputted from the CMOS inverter INV7 respectively. FIG. 4A also shows the voltage at a node N1, which is a connecting point of the gates of the P-channel type MOS transistors PM2, PM3, PM4, PM5, and PM6, as well as the voltage at a node N2, which is a connecting point of the gates the N-channel type MOS transistors NM2, NM3, NM4, NM5, and NM6.

SUMMARY OF THE INVENTION

The invention provides an oscillator circuit that includes a ring oscillator having a plurality of inverters of an odd number. Those inverters are connected serially, and the output of the last inverter of the odd number of the inverters is fed back as an input to the first of the odd number of the inverters. The oscillator circuit also includes a current limit circuit of current mirror type controlling a current supplied to the odd number of the inverters, and a supporting transistor receiving an output of one of the inverters that is located at an even numbered position from the last inverter so as to make the output of the last inverter swing between a power supply voltage and a reference voltage.

DETAILED DESCRIPTION OF THE INVENTION

Figure 3:
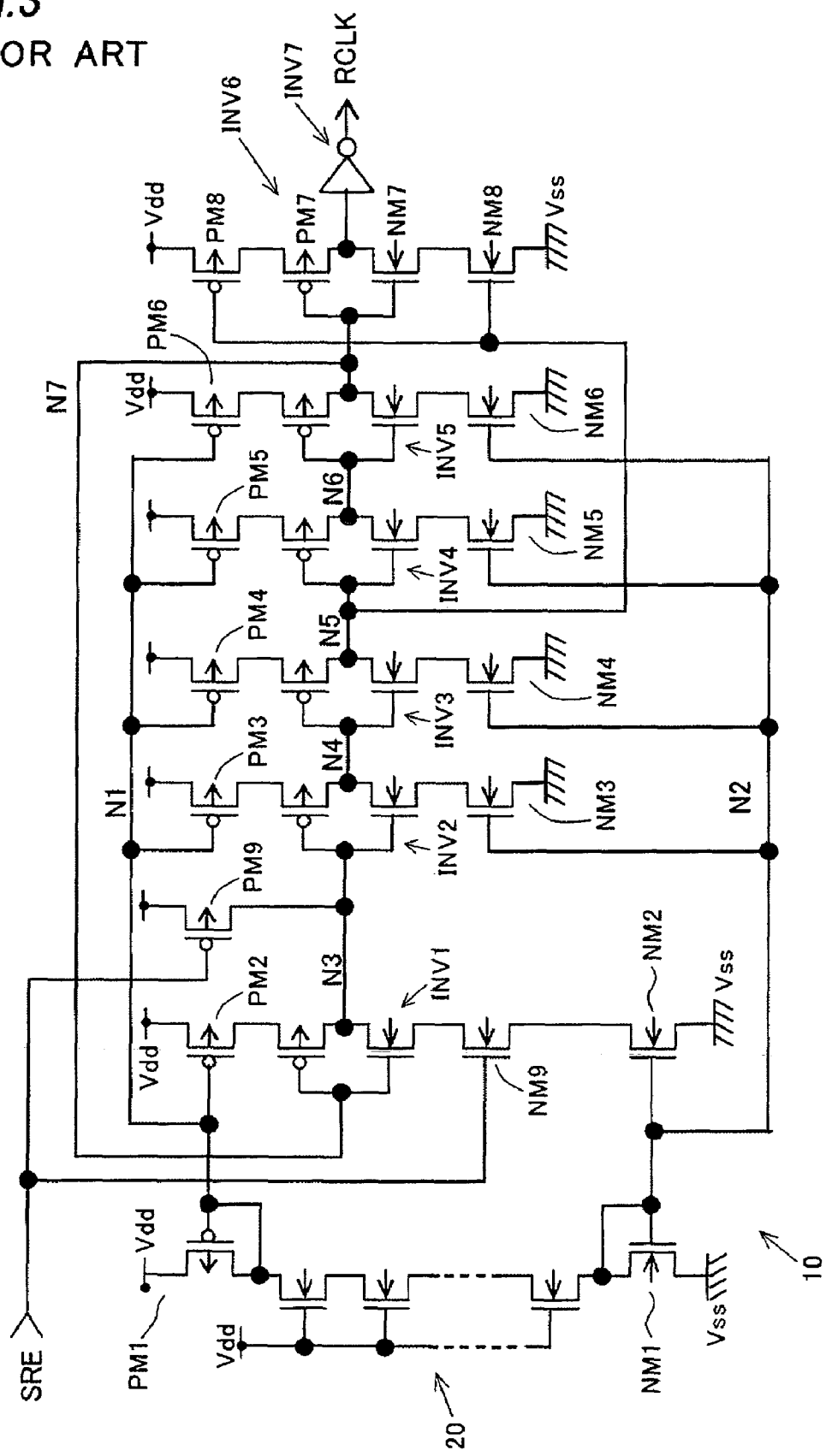
FIG. 3 is a circuit diagram showing an oscillator circuit of prior art.
Figure 4A:
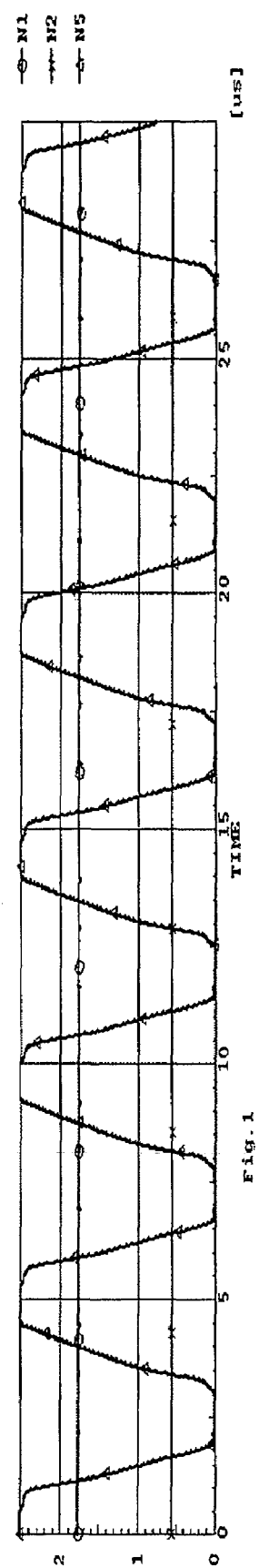
FIGS. 4A–4C show waveforms acquired from the circuit simulation of the oscillator circuit of the prior art.
Figure 4B:
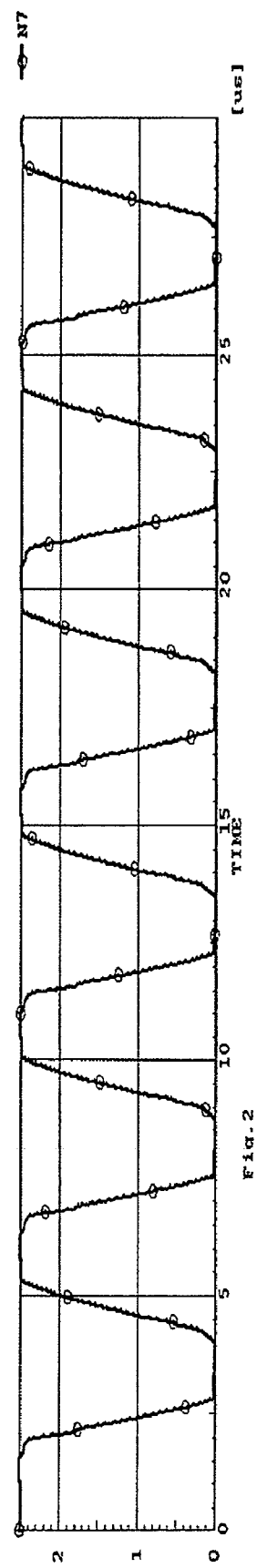
Figure 4C:
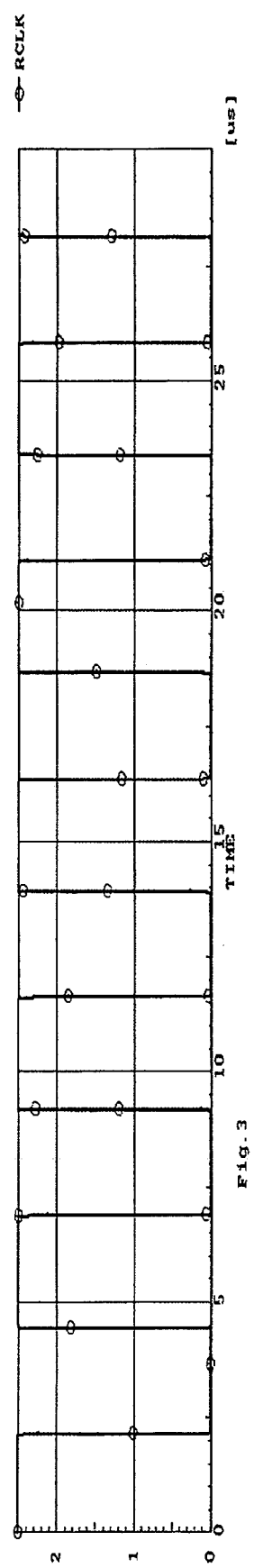

The electric current going through the CMOS inverters INV1–INV5 of the ring oscillator is adequately controlled by keeping the voltage of the node N1 and the node N2 at a certain level using the current mirror type current limit circuit 10 in the oscillator circuit shown in FIG. 3. However, there is a possibility that the change in a process parameter or the pattern layout deteriorates the balance of the voltage at the node N1 and the node N2. When that happens, the balance of the driving ability between the P-channel type MOS transistors PM2–PM6 with the voltage of the node N1 and the N-channel type MOS transistors NM2–NM6 with the voltage of the node N2 also changes.

In this case, it was found that the output of the CMOS inverters INV1–INV5 forming the ring oscillator does not completely reach the LOW level or HIGH level. This situation gets worse as the oscillation cycle repeats. A malfunction or a complete halt of the ring oscillator takes place at the final stage because the output of a CMOS inverter can not exceed the threshold value of the next CMOS inverter.

Figure 5A:
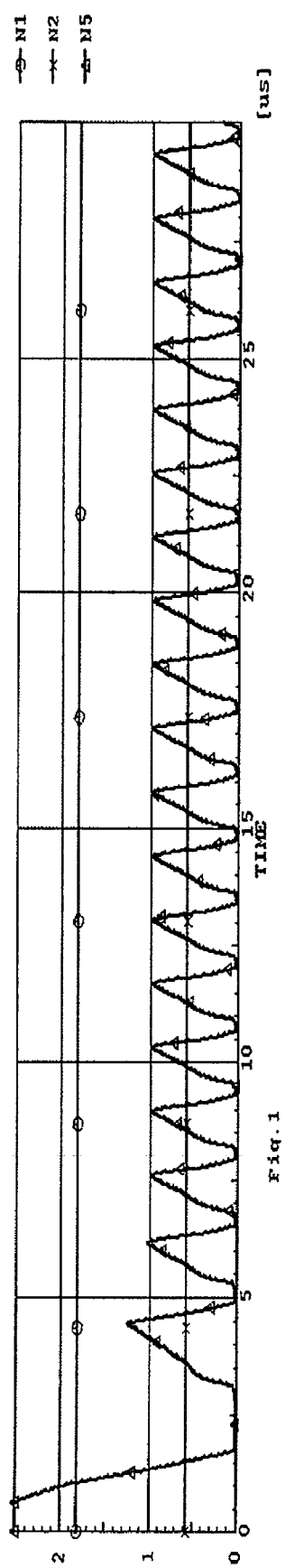
FIGS. 5A–5C show waveforms acquired from the circuit simulation of the oscillator circuit of the prior art under varying conditions.
Figure 5B:
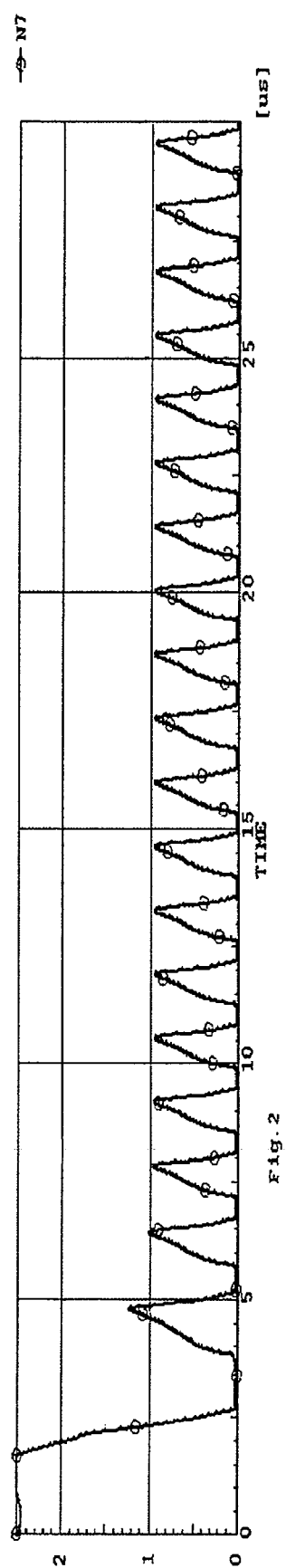
Figure 5C:
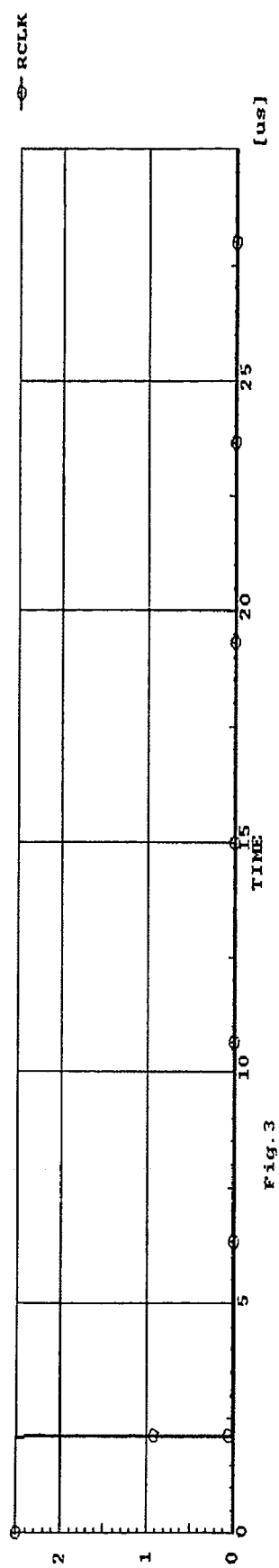

FIGS. 5A–5C show the waveforms as a result of such a malfunction of the oscillation based on a simulation. FIG. 5A is a waveform of the output of the CMOS inverter INV3 at the node N5, FIG. 5B is a waveform of the output of the last CMOS inverter INV5 at the node N7, and FIG. 5C is a waveform of the oscillation clock signal RCLK outputted from the CMOS inverter INV7, respectively. The impedance of the P-channel type MOS transistors PM2–PM6 becomes high, lowering the driving ability of the P-channel type MOS transistors compared to that of the N-channel type MOS transistors NM2–NM6 when the voltage of the node N1 slightly goes up. Then, the HIGH level of the output of the inverter INV3 at the node N5 does not reach the power supply voltage Vdd, as shown in FIG. 5A. The same thing happens to the HIGH level of the output of the inverter INV5 at the node N7 shown in FIG. 5B. Therefore, the oscillation clock signal RCLK stops completely as shown in FIG. 5C.

Figure 1:
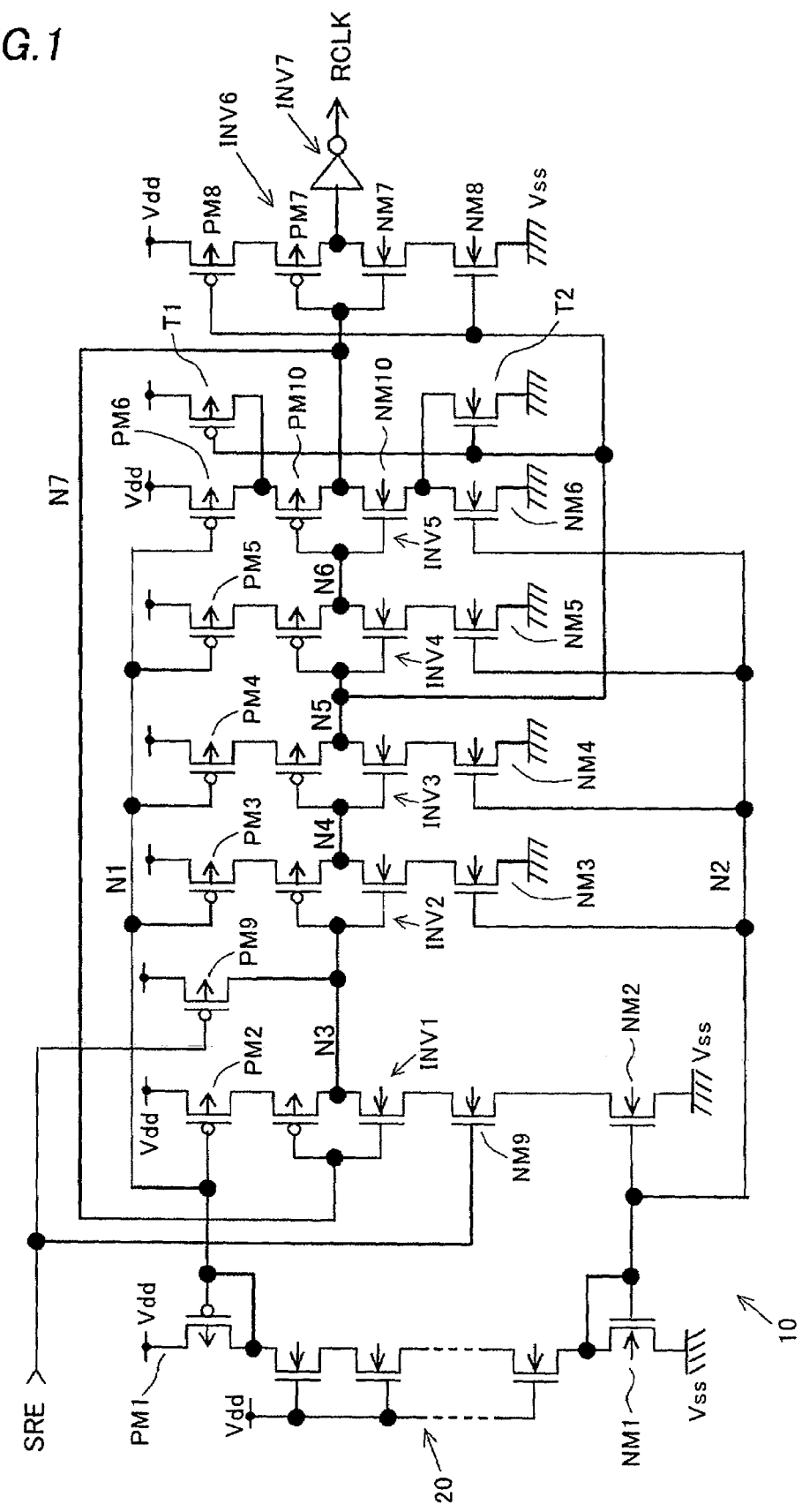
FIG. 1 is a circuit diagram showing an oscillator circuit of an embodiment of this invention.
Figure 2A:
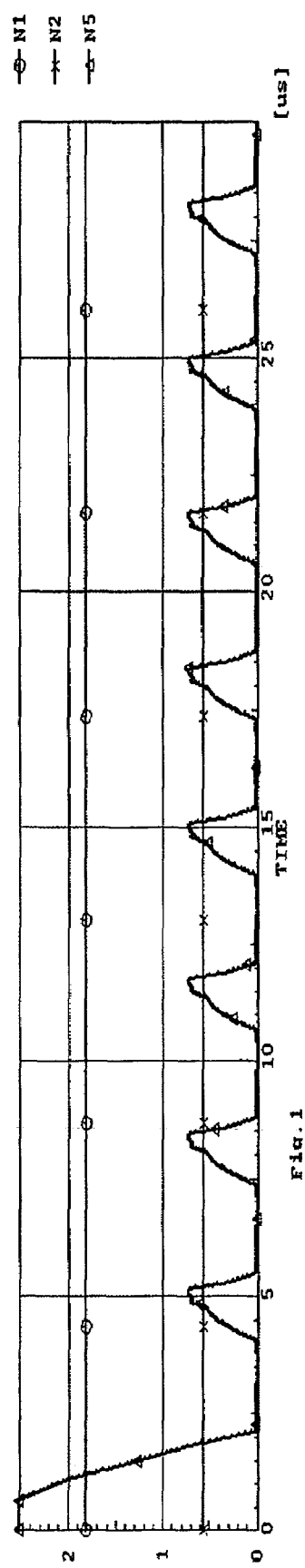
FIGS. 2A–2C show waveforms acquired from a circuit simulation of the oscillator circuit of the embodiment.
Figure 2B:
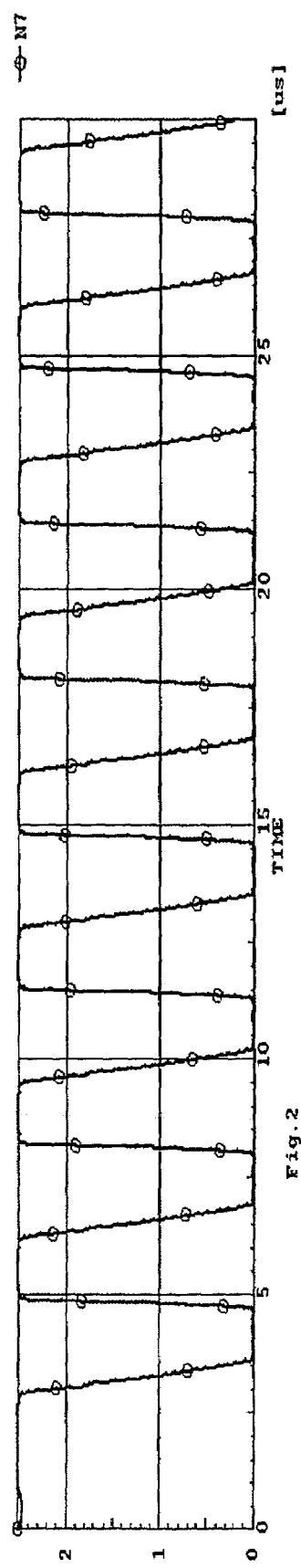
Figure 2C:
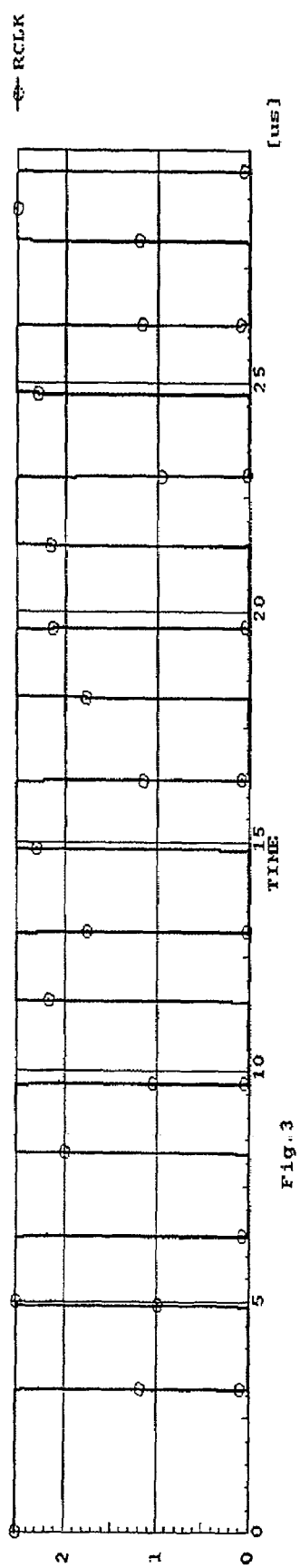

Next, an oscillator circuit of an embodiment of this invention will be explained by referring to FIGS. 1–2C. FIG. 1 is a circuit diagram of the oscillator circuit of this embodiment. The oscillator circuit has a first supporting transistor T1 that helps the output of the last CMOS inverter INV5 to perform the full-swing for reaching the power supply voltage Vdd and a second supporting transistor T2 that helps the output of the inverter INV5 to perform the full-swing for reaching a reference voltage, i.e., the ground voltage Vss in this embodiment, according to the output of a CMOS inverter INV3 positioned two positions ahead of the last CMOS inverter INV5. The other configuration of the circuit is the same as the circuit shown in FIG. 3.

In this embodiment, the first supporting transistor T1 is a P-channel type MOS transistor, with the source provided with the power supply voltage Vdd, the gate with the output of the CMOS inverter INV 3, and the drain connected to the source of a P-channel type MOS transistor PM10, to which the output of the previous CMOS inverter INV4 is applied. The source of the P-channel type MOS transistor PM10 is connected to the drain of the P-channel type MOS transistor PM6 to form a current mirror.

The second supporting transistor T2 is, in this embodiment, an N-channel type transistor, with the source provided with the ground voltage Vss, the gate with the output of the CMOS inverter INV3, and the drain connected to the source of an N-channel type MOS transistor NM10, to which the output of the previous CMOS inverter INV4 is applied. The source of the N-channel type MOS transistor NM10 is connected to the drain of the N-channel type MOS transistor NM6 to form a current mirror.

Next, the operation of the oscillator circuit is explained. The balance between the voltage of the node N1 and the voltage of the node N2 is kept when a current mirror type current limit circuit is normally operated, making the ring oscillator operates normally. The node N5, which is the output of the CMOS inverter INV3, makes full-swing between the power supply voltage Vdd and the ground voltage Vss, therefore the first and second supporting transistors T1 and T2 do not have any effect on the operation of the ring oscillator.

Next, the operation of the oscillator circuit when the voltage of the node N1 slightly goes up due to changes in a process parameter or the pattern layout will be explained by referring to the simulation waveform shown in FIGS. 2A–2C. The impedance of the P-channel type MOS transistors PM2–PM6 becomes high, lowering the driving ability of the P-channel type MOS transistors PM2–PM6 compared to that of the N-channel type MOS transistors NM2–NM6. Therefore, the HIGH level of the node N5, the output of the inverter INV3 does not reach the power supply voltage Vdd as shown in the waveform of the FIG. 2A.

However, the first supporting transistor T1 turns on by receiving the output of the node N5 that is not high enough for the HIGH level in the oscillator circuit of this invention. Then, the power supply voltage Vdd is fed to the P-channel type MOS transistor PM10 of the CMOS inverter INV5 with a low impedance. Therefore, the node N7, the output of the CMOS inverter INV5 makes the full-swing between the power supply voltage Vdd and the ground voltage Vss, as shown in FIG. 2B. The normal oscillation clock signal RCLK can be acquired from the CMOS inverter INV7 as shown in FIG. 2C.

Next, the operation of the oscillator circuit when the voltage of the node N2 slightly goes down due to changes in the process parameter or the pattern layout will be explained. The impedance of the N-channel MOS transistors NM2–NM6 becomes high, lowering the driving ability of the N-channel type MOS transistors NM2–NM6 compared to that of the P-channel type MOS transistors PM2–PM6. Therefore, the LOW level of the node N5, the output of the inverter INV3 does not go down to the ground voltage Vss.

However, the second supporting transistor T2 turns on by receiving the output of the node N5 that is not low enough for the LOW level in the oscillator circuit. Then, the ground voltage Vss is fed to the N-channel type MOS transistor NM10 of the CMOS inverter INV5 with a low impedance. Therefore, the node N7, the output of the CMOS inverter INV5 makes the full-swing between the power supply voltage Vdd and the ground voltage Vss. The normal oscillation signal RCLK can be acquired from the CMOS inverter INV7.

There are five CMOS inverters that form the ring oscillator in the above embodiment of this invention. However, this invention is not limited to this embodiment. The ring oscillator may be configured with the CMOS inverters in odd numbers three and above. Also, the output of the CMOS inverter INV3, which is two positions ahead of the last CMOS inverter INV5, is applied to the gates of the first and the second supporting transistors T1 and T2 in the above embodiment. However, other configuration is also possible. In general, it is possible to apply the output of the CMOS inverter located at even-numbered positions (the second position, the fourth position, and so on) counting from the last inverter.

According to this embodiment, the malfunction and the halt of the ring oscillator circuit due to the imbalance of the current mirror caused by changes in a process parameter or the pattern layout can be prevented in the ring oscillator circuit with the current mirror type current limit circuit.

What is claimed is:

1. An oscillator circuit comprising:
   a ring oscillator comprising a plurality of inverters of an odd number, the inverters being connected serially, and an output of the last inverter of the odd number of the inverters being fed back as an input to the first of the odd number of the inverters;
   a current limit circuit of current mirror type controlling a current supplied to the odd number of the inverters; and
   a supporting transistor receiving an output of one of the inverters that is located at an even numbered position from the last inverter so as to make the output of the last inverter swing between a power supply voltage and a reference voltage.

2. The oscillator circuit of claim 1, wherein the supporting transistor comprises a first P-channel type MOS transistor.

3. The oscillator circuit of claim 2, wherein the output of the inverter located at the even-numbered position is applied to a gate of the first P-channel type MOS transistor, the power supply voltage is applied to a source of the first P-channel type MOS transistor, and a drain of the first P-channel type MOS transistor is connected to a source of a second P-channel type MOS transistor that is part of the last inverter.

4. The oscillator circuit of claim 1, wherein the supporting transistor comprises a first N-channel type MOS transistor.

5. The oscillator circuit of claim 4, wherein the output of the inverter located at the even-numbered position is applied to a gate of the first N-channel type MOS transistor, the reference voltage is applied to a source of the first N-channel type MOS transistor, and a drain of the first N-channel type MOS transistor is connected to a source of a second N-channel type MOS transistor that is part of the last inverter.

6. An oscillator circuit comprising:
   a ring oscillator comprising a plurality of inverters of an odd number, the inverters being connected serially, and an output of the last inverter of the odd number of the inverters being fed back as an input to the first of the odd number of the inverters;
   a current limit circuit of current mirror type controlling a current supplied to the odd number of the inverters;
   a first P-channel type MOS transistor; and
   a first N-channel type MOS transistor, wherein
   an output of one of the inverters that is located at an even-numbered position from the last inverter is applied to a gate of the first P-channel type MOS transistor, a power supply voltage is applied to a source of the first P-channel type MOS transistor, and a drain of the first P-channel type MOS transistor is connected to a source of a second P-channel type MOS transistor that is part of the last inverter, and
   the output of the inverter located at the even-numbered position is applied to a gate of the first N-channel type MOS transistor, a reference voltage is applied to a source of the first N-channel type MOS transistor, and a drain of the first N-channel type MOS transistor is connected to a source of a second N-channel type MOS transistor that is part of the last inverter.

* * * * *